(12) United States Patent
Lipson et al.

(10) Patent No.: US 6,627,923 B1
(45) Date of Patent: Sep. 30, 2003

(54) RESONANT MICROCAVITIES

(75) Inventors: Michal Lipson, Waltham, MA (US); Lionel C. Kimerling, Concord, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 20 days.

(21) Appl. No.: 09/613,859

(22) Filed: Jul. 11, 2000

Related U.S. Application Data

(60) Provisional application No. 60/143,416, filed on Jul. 12, 1999.

(51) Int. Cl.[7] .................................................. H01L 33/00
(52) U.S. Cl. ........................................... 257/102; 372/40
(58) Field of Search ............................... 257/102; 372/40

(56) References Cited

U.S. PATENT DOCUMENTS

| | | | |
|---|---|---|---|
| 5,158,908 A | 10/1992 | Blonder et al. | 437/129 |
| 5,249,195 A * | 9/1993 | Feldman et al. | 372/45 |
| 5,363,398 A | 11/1994 | Glass et al. | 372/92 |
| 5,369,657 A | 11/1994 | Cho et al. | 372/39 |
| 5,475,528 A * | 12/1995 | LaBorde | 359/341 |
| 5,682,401 A | 10/1997 | Joannopoulos et al. | 372/96 |
| 5,859,867 A | 1/1999 | An et al. | 372/70 |
| 5,892,786 A | 4/1999 | Lott | 372/50 |
| 5,933,444 A | 8/1999 | Molva et al. | |

OTHER PUBLICATIONS

Zhu et al., "Vacuum Rabi Splitting as a Feature of Linear–Dispersion Theory: Analysis and Experimental Observations," *Physical Review Letters*, 64:2499–2502, May 21, 1990.

* cited by examiner

*Primary Examiner*—Long Pham
*Assistant Examiner*—Douglas A. Wille
(74) *Attorney, Agent, or Firm*—Fish & Richardson P.C.

(57) ABSTRACT

A condensed matter structure includes a substrate having a resonant microcavity formed by reflectors, having a reflectivity R, arranged relative to an optically-active material to form a cavity. The optically-active material has a thickness L, an optical emission line centered at a wavelength $\lambda_c$, and an optical absorption coefficient $\alpha_0$ at $\lambda_c$. The magnitude of absorption $(\alpha_0 L)$ at $\lambda_c$ by the optically-active material is greater than the probability $(1-R)$ that an electromagnetic field having an energy of $\lambda_c$ exits microcavity and thereby results in a strong light-matter interaction between the optically-active material and the electromagnetic field confined in the microcavity.

32 Claims, 12 Drawing Sheets

RESONANT MICROCAVITIES

CROSS REFERENCE TO RELATED APPLICATIONS

Pursuant to 35 USC §119(e), this application claims the benefit of prior U.S. provisional application 60/143,416, filed Jul. 12, 1999.

This invention was made with government support under Grant Number DMR-9808941 awarded by the National Science Foundation. The government has certain rights in the invention.

BACKGROUND OF THE INVENTION

This invention relates generally to a resonant microcavity and, more particularly, to a resonant microcavity which produces a strong light-matter interaction.

A resonant microcavity, typically, is formed in a substrate, such as silicon, and has dimensions that are on the order of microns or fractions of microns. The resonant microcavity contains optically-active matter (i.e., luminescent material) and reflectors which confine light in the optically-active matter. The confined light interacts with the optically-active matter to produce a light-matter interaction.

The light-matter interaction in a microcavity can be characterized as strong or weak. Weak interactions do not alter energy levels in the matter, whereas strong interactions alter energy levels in the matter. In strong light-matter interaction arrangements, the confined light can be made to resonate with these energy level transitions to change properties of the microcavity.

SUMMARY

In general, in one aspect, the invention is a structure, i.e., a condensed matter system, including a resonant microcavity formed by reflectors (with a reflectivity R) arranged relative to an optically-active material to form a cavity. The optically-active material has a thickness L, an optical emission line centered at a wavelength $\lambda_c$, and an optical absorption coefficient $\alpha_0$ at $\lambda_c$. The optical emission line has a homogeneous spectral width $\delta$ and an inhomogeneous spectral width $\Delta$. In the structure, $\alpha_0 L >> (1-R)$ and $$\Delta < 2\sqrt{\frac{\alpha_0 L \delta^2}{(1-R)}}.$$

As a result, the microcavity produces strong light-matter interactions between the optically-active material and an electromagnetic field confined in the cavity.

Strong light-matter interactions mix the states of the optically-active material and confined light (vacuum electromagnetic field) in the microcavity to produce two new mixed states, each of which are a superposition of the optically-active material state and the vacuum electromagnetic field state. The two new mixed states are split apart in energy by the so-called Vacuum Rabi Splitting (VRS). The VRS is on the order of a few meV (nanometers). The energy splitting between the two non-degenerate mixed states is a function of the reflectivity (R) of the microcavity, the thickness (L) and the absorption strength ($\alpha_0$) of the optically-active material. Altering one or more of these parameters changes the energy by which the two mixed states are split which, in turn, affects the reflectivity characteristics of the microcavity at the wavelength of the two states. For a specific set of VRS parameters, R, L, and $\alpha_0$, the reflectivity characteristics of the two mixed states also can be changed by "tuning" the length of the microcavity to alter the resonant cavity mode such that it is in or out of resonance with the optically-active material emission line. For example, tuned and untuned microcavities may transmit/reflect different wavelengths of light and can be used to construct tunable optical devices which switch between reflecting and transmitting certain wavelengths.

The intensity (population) in the two superposition states oscillates back and forth at a specific rate commonly called the Rabi oscillation frequency. The Rabi oscillation frequency for the two non-degenerate mixed states in the microcavity can be in the gigahertz (GHz) to terahertz (THz) range. As a result, the microcavity can be used in THz devices, such as emitters and detectors.

This aspect of the invention may include one or more of the following features/functions. The ratio $\alpha_0 L/(1-R)$ is greater than about 10; greater than about 100; or greater than about 10006. The ratio $$\left(\Delta/2 \sqrt{\frac{\alpha_0 L \delta^2}{(1-R)}}\right)$$

is less than about 1; less than about 0.1; or less than about 0.01. The microcavity may be a Fabry-Perot cavity having an optical resonance at wavelengths between about $\lambda - 2\Delta$ and about $\lambda + 2\Delta$; between about $\lambda - \Delta$ and about $\lambda + \Delta$; or between about $\lambda - 0.1\Delta$ and about $\lambda + 0.1\Delta$. The reflectors may be arranged at opposite sides of the optically-active material.

The reflectors may include metal films and/or Distributed Bragg Reflectors (DBR). The DBRs may be arranged on opposite sides of the microcavity. Each DBR typically includes alternating layers of material having different indices of refraction. The alternating layers of material may include one or more of the following: semiconductors, conductive matter oxides, glasses, glass-like oxides, and polymers. The alternating layers typically have high and low indices of refraction $n_H$ and $n_L$ and thicknesses on the order of $\lambda_c/4n_H$ and $\lambda_c/4n_L$, respectively. Each DBR may include between 2 and 22 alternating layers. The thickness of the microcavity is an integer multiple of a half wavelength, $\lambda_c/2$, divided by the index of refraction of the optically-active matter, n.

The optically-active material in the microcavity may include Er or $Er_2O_3$ embedded in a layer of $SiO_2$, crystalline $Er_2O_3$, a rare earth doped layer of Si, and/or a rare earth doped layer of $SiO_2$. The material may include a rare earth doped host matter such as one or more of the lanthanide series elements with numbers 57 through 71. The host matter has a negligible luminescence at $\lambda$. The material may include a semiconducting light-emitting matter, such as one or more of the following: GaAs, GaAlAs, GaInAs, GaInPAs, GaN, GaP, and InP. The material may include a doped semiconductor which emits radiation at a wavelength that is higher than a semiconductor band gap transition associated with the doped semiconductor.

The structure may be included in an apparatus, such as an optical switch, a THz emitter, a THz detector, a wavelength modulator, a wavelength-division multiplexer, and/or a waveguide cross-connect.

The foregoing condensed matter structure has the following advantages. The structure does not require inordinately high finesse or Q values to achieve strong light-matter interactions. The resonant microcavity is operable over a relatively wide range of temperatures, including room temperature. The strong light-matter interaction also provides a sensitive cavity structure, i.e., a resonator, which responds to changes in the index of refraction of the reflectors. Additionally, the resonator can be produced with a wide range of optically-active materials. Consequently, the structure has a wide range of applications in electronic and optoelectronic devices.

Other advantages and features will become apparent from the following description, claims, and drawings.

DETAILED DESCRIPTION

Figure 1:
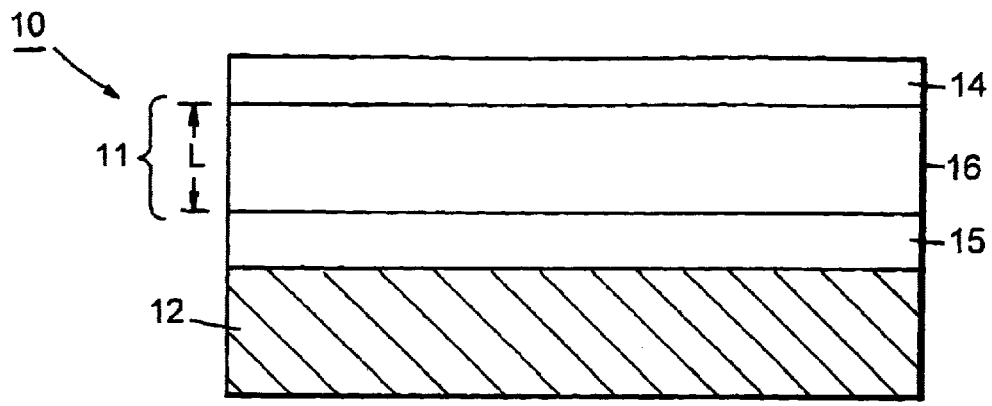
FIG. 1 is a side view of a structure that includes a resonant microcavity, reflectors, and optically-active material embedded in the microcavity.

FIG. 1 shows a structure 10 which includes a monolithic Fabry-Perot resonant microcavity 11. Resonant microcavity 11 is formed on a substrate 12, such as silicon. Silicon may be chosen as the substrate to increase compatibility with silicon-based integrated circuits. Other types of materials may be used, however, including, but not limited to, semiconductors, glasses, and ceramics.

Top and bottom reflectors 14 and 15, respectively, are arranged at opposite surfaces of an optically-active layer 16 to form a microcavity 11. Optically-active layer 16 has an optical emission centered at a wavelength $\lambda_c$, an optical absorption coefficient $\alpha_0$ at $\lambda_c$, a homogeneous spectral width $\delta$ and an inhomogeneous spectral width $\Delta$ centered about $\lambda_c$, and a thickness L which defines the spacing between the two reflectors. The wavelengths which are resonant (the cavity resonance modes) in microcavity 11 are proportional to the separation of the reflectors. At the resonant wavelength of the cavity ($\lambda_{cav}$), the transmission of the Fabry-Perot microcavity approaches unity.

Reflectors 14 and 15 have a reflectivity (R) and are spaced apart by a distance that is sufficient to confine light within microcavity 11. The absolute energy of the light (vacuum electromagnetic field) confined in the cavity is a function of the spacing of the microcavity. As the spacing increases (decreases), the energy level of the vacuum electromagnetic field decreases (increases). The microcavity produces, as described below, a strong light-matter interaction between the vacuum electromagnetic field and optically-active layer 16 when the microcavity confines a vacuum electromagnetic field having an energy near the optical emission at $\lambda_c$ of the layer, i.e., when $\lambda_{cav}$ is approximately equal to $\lambda_c$.

Examples of reflectors that may be used are thin metal films and Distributed Bragg Reflectors (DBRs). DBRs are formed of alternating layers of materials having different indices of refraction.

Figure 2:
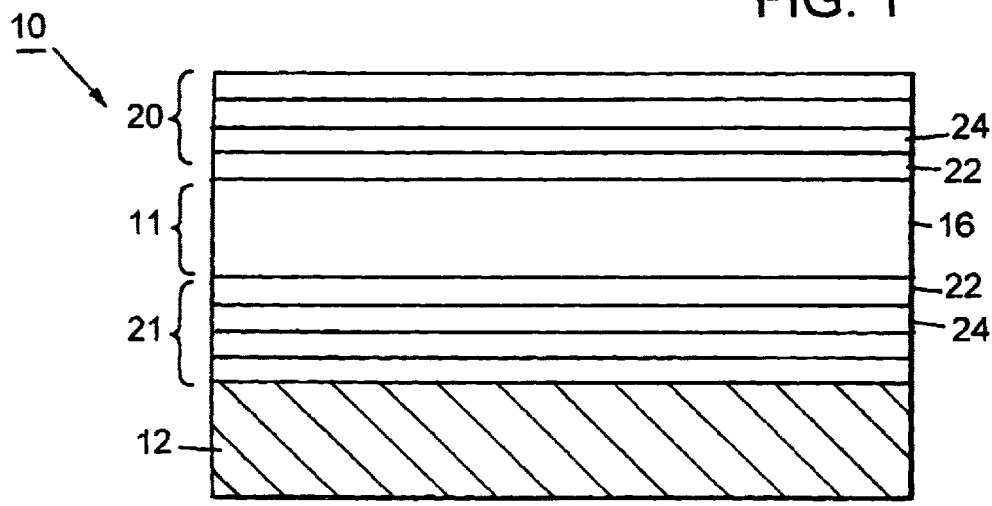
FIG. 2 is an alterative embodiment of the structure in which the reflectors are DBRs.

FIG. 2 shows DBRs 20 and 21 incorporated into structure 10. DBRs 20 and 21 contain two pairs of layers, such as 22 and 24. In each pair, a layer 22 has an index of refraction ($n_H$) and layer 24 has an index of refraction ($n_L$) that is lower than the index of refraction ($n_H$) of layer 22. The thickness of each of layers 22 and 24 is roughly $\lambda_c/4n_H$ and $\lambda_c/4n_L$, respectively, where $\lambda_c$ is defined above. In other embodiments, the order of the DBR layers can be reversed.

Each of DBRs 20 and 21 contains between two and twenty-two alternating layers of material (though DBRs having more layers may be used as well). Examples of materials that may be used for the alternating layers include semiconductors, conductive matter oxides, glasses, glass-like oxides, and polymers. The same two materials may alternate within the layers or in some embodiments pairs of different materials may be used in the alternating layers. The thickness L of optically-active layer 16 is an integer multiple of $\lambda_c/2n$, where n is the average index of refraction of the optically-active layer.

Optically-active layer 16 includes an optically-active material. The optically-active layer can be formed from a single optically-active material or an optically-active material embedded within another optically-inactive material. Suitable optically-active materials include atoms, molecules, compositions, or combinations thereof, which are compatible with the other materials of the microcavity and have energy levels capable of interacting with the electromagnetic field confined by the cavity. Examples of optically-active layers include, but are not limited to: Er or $Er_2O_3$ embedded in a layer of $SiO_2$; crystalline $Er_2O_3$; a rare earth doped layer of Si; a rare earth doped layer of $SiO_2$; a rare earth doped host material, the host material having a negligible luminescence (meaning a zero, or very low, luminescence), such as one or more lanthanide series elements with numbers fifty-seven through seventy-one; a semiconducting light-emitting material such as GaAs, GaAlAs, GaInAs, GaInPAs, GaN, GaP, and/or InP; and/or a doped semiconductor that emits radiation at a wavelength that is higher than a semiconductor band gap transition associated with the doped semiconductor.

Figure 3A:
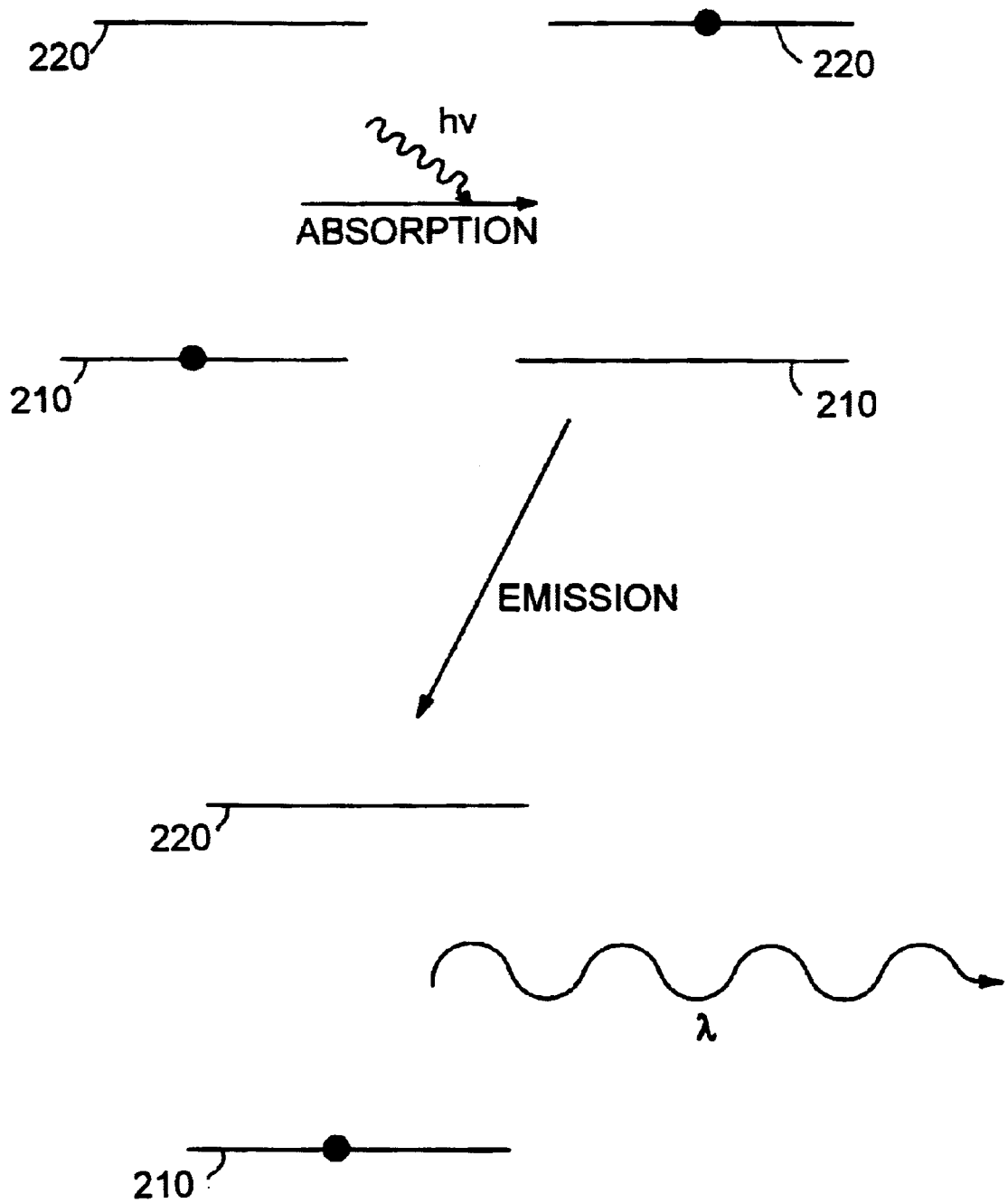
FIGS. 3A and 3B are schematic representations of light-matter interactions.

Referring to FIG. 3A, a weak light-matter interaction between a light signal ("or probe") and the optically-active material is produced when the light signal has a wavelength which is absorbed by the optically-active layer causing the optically-active material to be excited from an initial lower energy state 210 into an excited higher energy state 220. Material in the excited state may spontaneously emit radiation at wavelength $\lambda$ and relax back into the initial state. The exact wavelength of the optical emission depends upon the difference in energy between the excited and initial states which, in turn, depends upon the composition of the optically-active material. For simplicity only one higher energy state is shown for the optically-active material. In some embodiments, the weak light-matter interaction of absorption and emission may involve more than two states, i.e., multiple excited states.

The magnitude at which the optically-active layer absorbs the light signal is proportional to the expression $$\alpha_0 L \quad (1)$$

where $\alpha_0$ is the line center absorption coefficient at $\lambda_c$, and L is the thickness of the optically-active layer. The value $\alpha_0 L$ is determined as follows $$\alpha_0 \cdot L = \frac{2 f_0 N e^2 L \delta}{mc^2}, \quad (2)$$

where $f_0$ is an oscillator strength of the transition between the initial and excited states of the optically-active material, m is the electron mass of the absorbing material in optically-active layer 16, c is the speed of light in a vacuum, N is the density of optically-active material in layer 16, $\delta$ is the homogeneous spectral width, and e is the unit electric charge.

A strong light-matter interaction is produced when the optically-active material is disposed within a microcavity structure in which the magnitude of absorption at $\lambda_c$ by the optically-active material is greater than the probability that electromagnetic fields having an energy of wavelength $\lambda_c$ exit microcavity 11. This situation is obtained when the microcavity confines an electromagnetic field having an energy of $\lambda_c$ (vacuum electromagnetic field) such that the electromagnetic field is reabsorbed and reemitted by the optically-active material a number of times before exiting the cavity. In order to confine an electromagnetic field having an energy of $\lambda_c$ within the microcavity, the resonant cavity mode, $\lambda_{cav}$, should be coincident with $\lambda_c$.

Figure 3B:
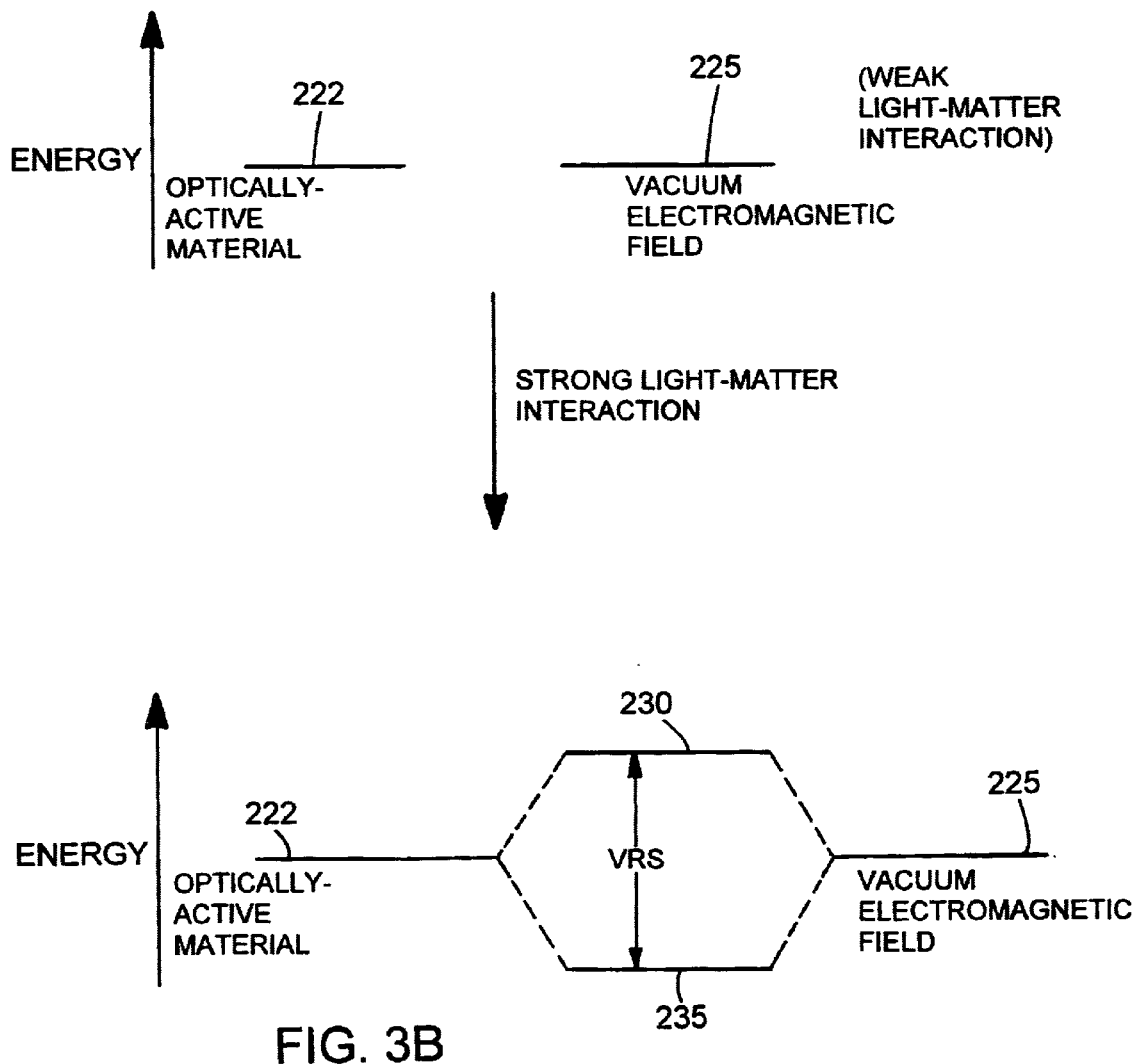

Referring to FIG. 3B, when the optically-active material is positioned between two reflectors such as shown in FIG. 1, the resulting microcavity confines a vacuum electromagnetic field having an energy of $\lambda$ in the optically-active layer to cause mixing between states of the optically-active material emission line 222 and the confined light (vacuum electromagnetic field) 225, and thereby produce two non-degenerate mixed states 230 and 235, each of which are a superposition of the optically-active material emission line state and the vacuum electromagnetic field state. Optically-active material emission line 222 is a state having an energy equal to the difference between levels 220 and 210 shown in FIG. 3A. The difference in energy between the two non-degenerate mixed states 230 and 235, the Vacuum Rabi Splitting (VRS), is given by $$VRS \alpha \sqrt{\frac{\alpha_0 L \delta^2}{(1-R)}}, \quad (3)$$

where, as noted above, L is the thickness of optically-active layer 16, $\delta$ is the homogeneous spectral width centered about $\lambda_c$, $\alpha_0$ is the optical absorption coefficient of optically-active layer 16 at $\lambda_c$ and R is the average reflectivity of the reflectors at $\lambda_c$.

For the VRS in microcavity 11 to be observed, three conditions should be met. According to the first condition, the energy of the vacuum electromagnetic field state 225, which is a function of the microcavity spacing or resonant cavity mode, should be degenerate with the energy state of the optically-active material emission line 222 to promote maximal mixing between the two states to form two non-degenerate mixed states 230 and 235. As the resonant cavity mode is detuned from resonance with the energy state of the optically-active material emission line, the amount of mixing between the two states decreases. In general, the microcavity spacing is such that the energy difference between the two energy states is small enough to mix the two states to produce two non-degenerate mixed states. Typically, the ratio of the vacuum electromagnetic field state energy and the optically-active material state energy is between about 0.9 and about 1.1. Typically, the microcavity spacing is such that the resonant cavity mode, i.e., the energy of the vacuum electromagnetic field state, is between about $\lambda_c \pm 2\Delta$. The resonant cavity mode may also be between about $\lambda_c \pm \Delta$ or about $\lambda_c \pm 0.1\Delta$. According to the second condition, the magnitude of absorption by the optically-active material in layer 16 ($\alpha_0 L$) and the reflectivity (R) of each of reflectors 14 and 15 should be such that $$\alpha_0 \cdot L >> (1-R). \quad (4)$$

This inequality produces the strong light-matter interaction. The ratio of the magnitude of absorption to the microcavity transmission, i.e., $\alpha_0 L/(1-R)$, typically, is greater than about 10. In some embodiments, this ratio is greater than about 100 or greater than about 1,000. According to the third condition, the inhomogeneous spectral width, $\Delta$, should be $$\Delta < 2 \sqrt{\frac{\alpha_0 L \delta^2}{(1-R)}}. \quad (5)$$

such that the VRS splitting of the two non-degenerate mixed states is not masked by the inhomogeneous spectral width of emission at $\lambda_c$ from the optically-active material. The ratio $\Delta/(2 \cdot VRS)$ is typically less than about 1. In some embodiments, the ratio is less than about 0.1 or less than about 0.01.

Figure 4A:
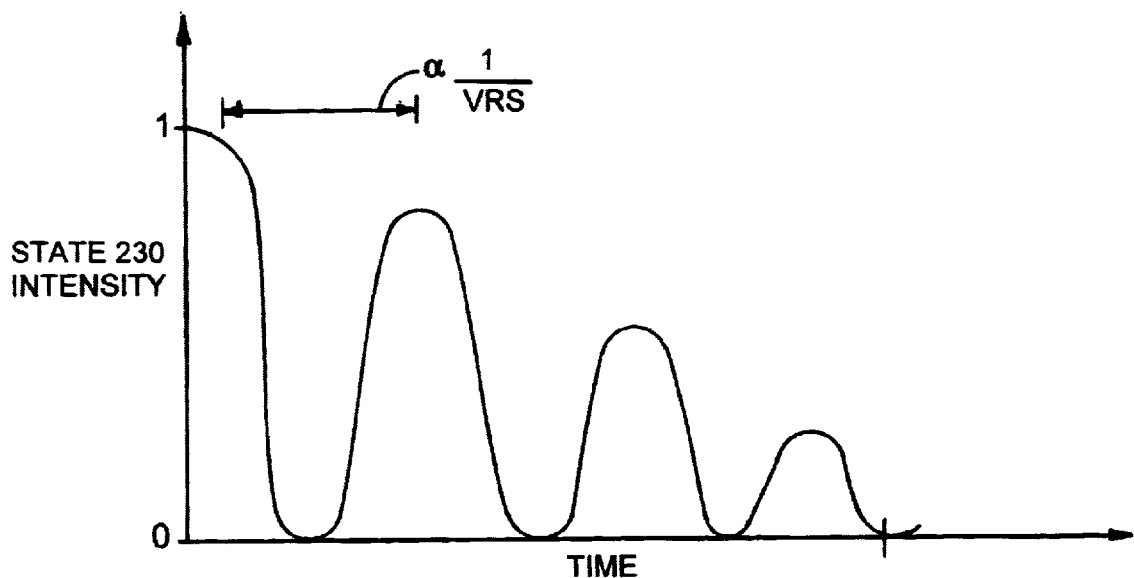
FIGS. 4A and 4B are schematic representations of the temporal profile of a light signal emitted by optically-active material in microcavity.
Figure 4B:
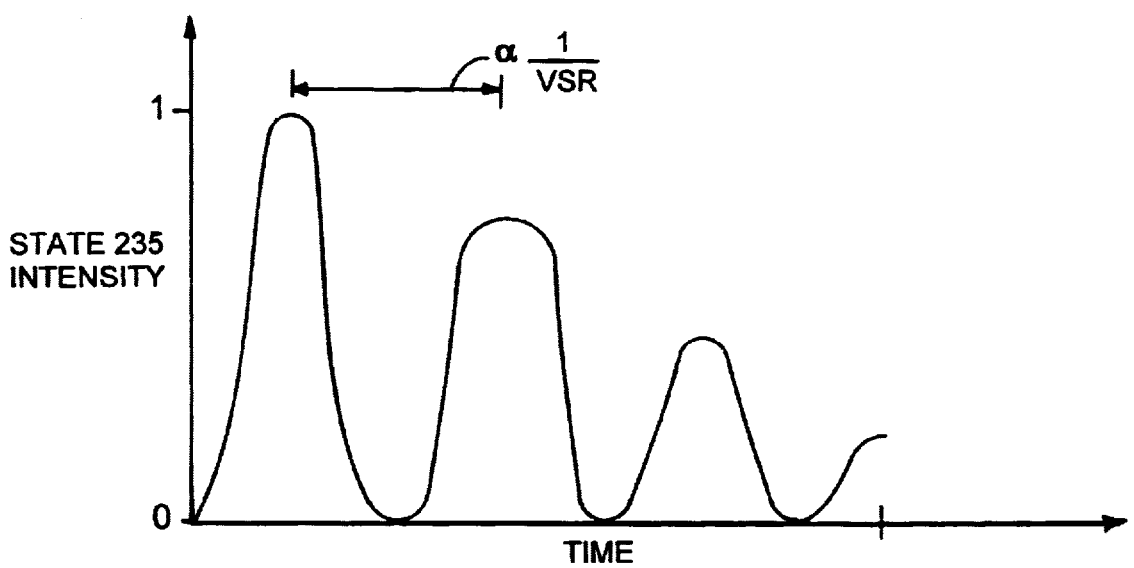

Referring to FIGS. 4A and 4B, VRS also affects the time evolution of light emitted from the optically-active material. An emission output signal 100 centered at either of the two non-degenerate mixed states (230, 235) includes a temporal modulation having a frequency proportional to 1/VRS which results from the time evolution of the optically-active material and the confined electromagnetic field states. Due to the magnitude of VRS, the frequency of the modulation can be in the GHz to THz range. The exact frequency depends upon the VRS splitting given in Eqn. 3. The two non-degenerate mixed states (230, 235) are out of phase by 180 degrees.

Strong and observable light-matter interactions are produced when the microcavity has a cavity mode nearly resonant with $\lambda_c$ and by designing the cavity so as to satisfy the inequalities of Eqns. 4 and 5, for example, by increasing the magnitude of the absorption of the optically-active layer, by increasing the reflectivity of the reflectors, or both. An increase in the magnitude of absorption is obtained by increasing the density, N, of optically-active material in the optically-active layer (Eqn. 2), and an increase in the reflectivity of the DBR reflectors is obtained by increasing the number of pairs of layers in the DBR reflectors. The reflectivity of the DBR reflectors is proportional to $$R = 1 - 4\left(\frac{n_L}{n_H}\right)^{2M} \quad (6)$$

where M is the number of periods, and $n_H$ and $n_L$ are defined above.

Figure 5:
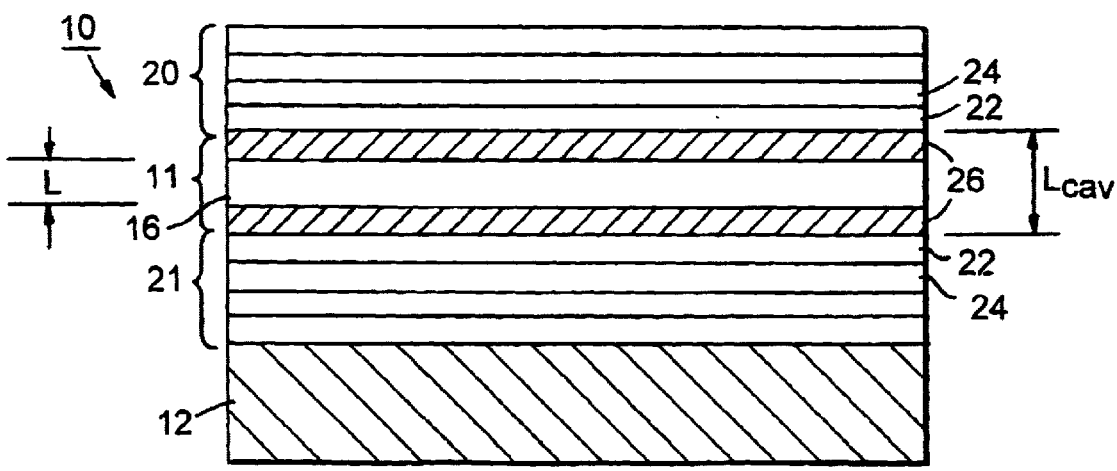
FIG. 5 is an alternative embodiment of the structure of FIG. 2 in which optically-inactive material is embedded in the microcavity.
Figure 6:
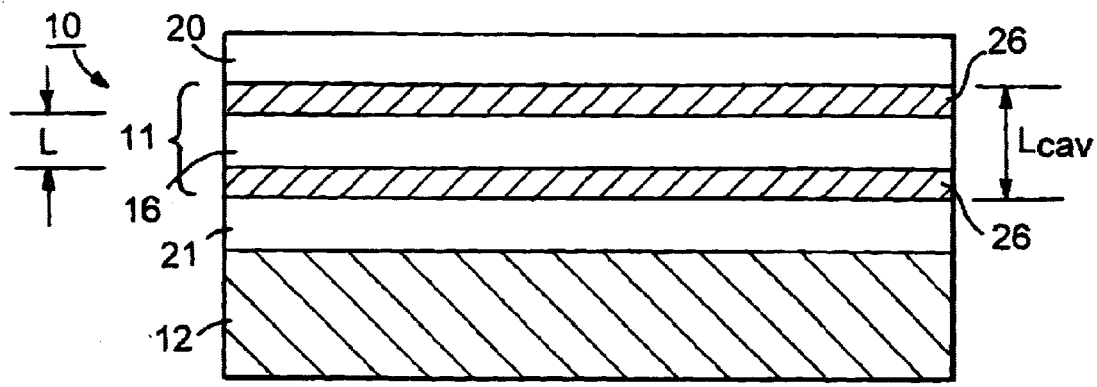
FIG. 6 is an alternative embodiment of the structure of FIG. 1 in which optically-inactive material is embedded in the microcavity.

Referring to FIGS. 5 and 6, microcavity 11 may also contain one or more optically-inactive layers 26 disposed on either side of the optically-active layer. Optically-inactive matter 26 is either not capable of spontaneous emission (energy level changes) or its emission is low enough not to be considered to be emissive at the wavelength $\lambda_c$ of optically-active layer 16. The optically-inactive layer has little effect on the VRS, except insofar as it affects other microcavity parameters, such as the thickness (resonant cavity modes) of microcavity 11.

In this regard, the thickness $L_{cav}$ of microcavity 11, i.e., the optically-active layer 16, L, plus optically-inactive layers 26, is an integer multiple of $\lambda_c/2$, and is given by the relationship $$\left(\sum_i (n_i L_i)\right) = K\frac{\lambda_c}{2} \quad (7)$$

where the index i identifies each layer (26, 16, and 26) in the microcavity, $n_i$ is the index of refraction of the the layer, $L_i$ is the thickness of the ith layer, and K is an integer. If the average index of refraction for microcavity 11, i.e., $(n_{16} + 2n_{26})/3$, is higher than the average index of refraction of reflectors 20 and 21, alternating layers in top DBR 20 and bottom DBR 21 are deposited so that layers with lower indices of refraction $n_L$ are adjacent to the layers in microcavity 11. In this case, $L_{cav}$ is an even-numbered multiple of $\lambda_c/2$, i.e., K in Eqn. 7 is even. If the average index of refraction of the layers in microcavity 11 is lower than the average index of refraction of reflectors 20 and 21, alternating layers in top DBR 20 and bottom DBR 21 are deposited so that layers with higher indices of refraction $n_H$ are adjacent to the layers in microcavity 11. In this case, $L_{cav}$ is an odd-numbered multiple of $\lambda_c/2$, i.e., K in Eqn. 7 is odd.

An embodiment will now be described that has the structure shown in FIG. 7 and that uses $Er_2O_3$ as the optically-active layer 16. This embodiment uses a Si substrate 12 and optically-inactive $SiO_2$ layers 26 disposed on each side of optically-active layer 16.

Optically-inactive $SiO_2$ layers 26 each have a thickness of about 2800 Å, and optically-active $Er_2O_3$ layer 16 has a thickness of about 1600 Å. The $Er_2O_3$ layer 16 is formed by evaporation of Er on a DBR reflector followed by thermal oxidation at a temperature of about 1000° C. in ambient $O_2$. After oxidation, the resulting $Er_2O_3$ layer has an optical emission line centered at $\lambda_c$=1537 nm. The density of $Er^{3+}$ in the layer is about $10^{23}/cm^3$. The thickness $L_{cav}$ of microcavity 11, in this case, is equal to the thickness of layer 16, L, plus the thickness of each optically-inactive layer and is an odd multiple of $\lambda_c/2$, as described above with respect to Eqn. 7. The index of refraction for the $Er_2O_3$ layer is about 1.6 and the index of refraction of the $SiO_2$ layers is about 1.45. Microcavity 11 has a resonant cavity mode at a wavelength between $\lambda_c \pm 2\Delta$. The exact resonant cavity mode is proportional to the thickness, $L_{cav}$, of microcavity 11, and is selected such that the microcavity resonates with the $Er^{3+}$ 4f inner shell optical transition of $Er_2O_3$ at $\lambda_c$=1537 nm to produce a vacuum electromagnetic field state having an energy of about $\lambda_c$=1537 nm.

Figure 8:
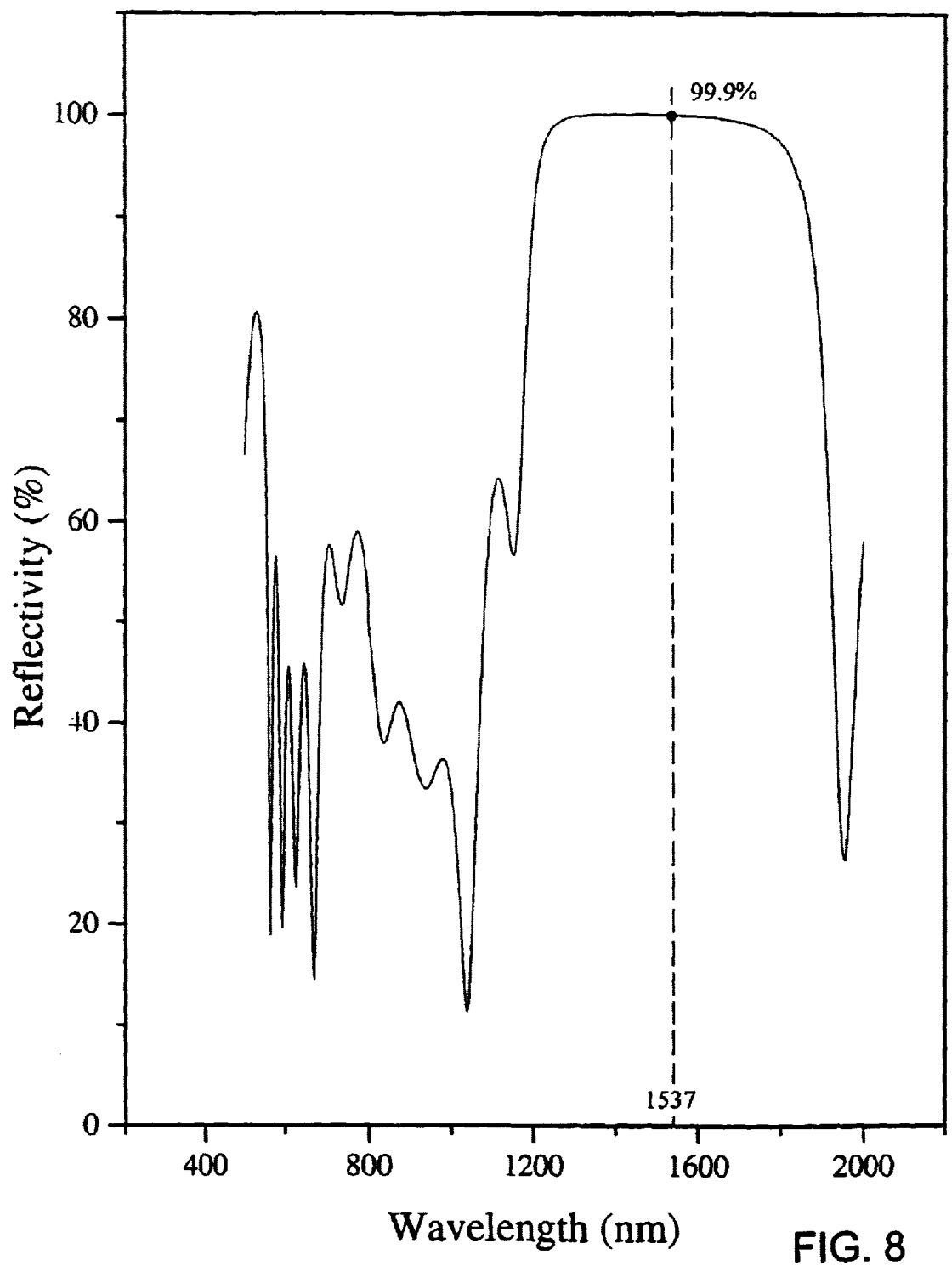
FIG. 8 is a graph showing the reflectivity of DBRs for an $Er_2O_3$ layer having an optical emission line centered at $\lambda=1537$ nm.

Top DBR 20 and bottom DBR 21 are each made of five pairs of alternating quarter-wavelength layers. Each pair includes a layer 22 of Si and a layer 24 of $SiO_2$. Layer 22 of Si has an index of refraction (n) that is about 3.3 and has a thickness of about 2650 Å. Layer 24 of $SiO_2$ has an n of about 1.45 and a thickness of about 1130 Å. Layers 22 and 24 are grown on Si substrate 12 using plasma-enhanced vapor deposition. FIG. 8 shows the reflectivity of DBRs 20 and 21. The reflectivity of DBRs 20 and 21 at $\lambda_c$=1537 nm, the emission wavelength of the $Er_2O_3$, is about 99.9%.

The optical absorption $\alpha_0 L$ of the $Er_2O_3$ layer 16 in structure 10 is about $10^{-2}$ and the finesse $$\frac{\pi\sqrt{R}}{(1-R)}$$

of the microcavity is about $10^3$. The ratio of $\alpha_0 L/(1-R)$ is about 10. The homogeneous spectral width, $\delta$, is about 0.5 nm and the inhomogeneous spectral width, $\Delta$, is about 1.5 nm. Based on these parameters, the ratio of $\Delta/(2 \cdot VRS)$ is about 0.3. As a result, the conditions for observing VRS, specified in Eqns. 4 and 5, are satisfied and the VRS splitting is on the order of about 3 nm.

Figure 7:
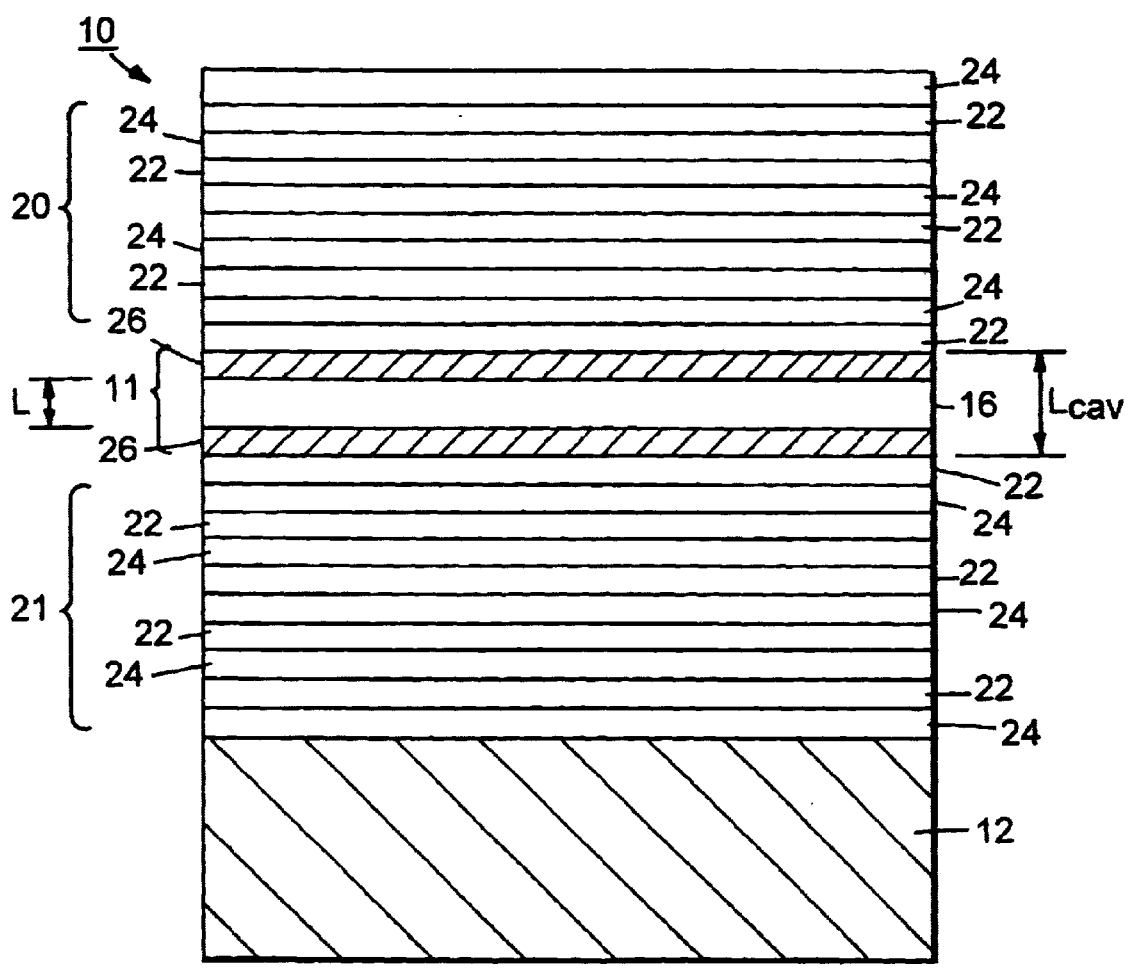
FIG. 7 shows an alternative configuration for the structure of FIG. 2.
Figure 9:
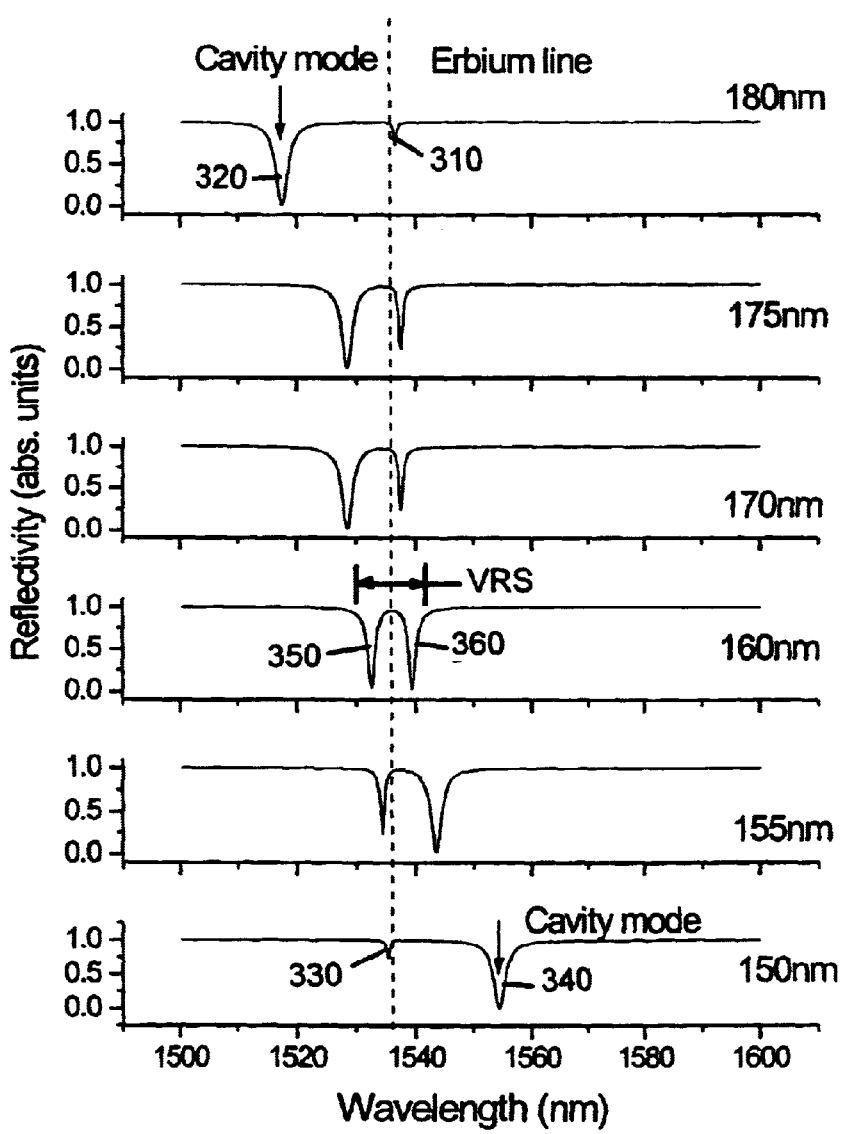
FIGS. 9A to 9F are graphs showing calculated reflectivity spectra of the microcavity structure of FIG. 7.

In FIGS. 9A–9F, calculated reflectivity spectra of a structure similar to that of FIG. 7 are shown for several different resonant cavity modes, $\lambda_{cav}$, of the microcavity. Different resonant cavity modes change the energy of the vacuum electromagnetic field state which, in turn, affects the amount of mixing between the confined electromagnetic field and optically-active material states. FIG. 9A shows a reflectivity spectrum in which the cavity mode is tuned to higher energies (shorter $L_{cav}$) relative to the $Er^{3+}$ resonance. This spectrum exhibits two transmission features, a feature 310 near the $Er^{3+}$ resonance and another feature 320 at the cavity mode resonance. FIG. 9F shows a reflectivity spectrum in which the cavity mode is tuned to lower energies (longer $L_{cav}$) relative to the $Er^{3+}$ resonance. This spectrum also exhibits two transmission features, a feature 330 near the $Er^{3+}$ resonance and another feature 340 at the cavity mode resonance. FIGS. 9B through 9E show reflectivity spectra for a range of cavity resonances. The reflectivity spectrum shown in FIG. 9D results when the cavity mode is approximately resonant with the $Er^{3+}$ resonance at about 1537 nm. This condition causes maximal mixing between the vacuum electromagnetic field state and the optically-active material state to produce two non-degenerate mixed states 350 and 360 split apart in energy by VRS.

The reflectivity of the structure shown in FIG. 7 was measured by placing it in a liquid helium immersion dewar at 15K. An infrared (IR) probe beam aligned relative to and incident on the surface of DBR 20 was introduced into microcavity 11. The reflected probe beam which is perpendicular to the incident probe was imaged into a spectrometer, with a spectral resolution of about 5 Å. Approximately 50 $\mu W/cm^2$ probe power was directed onto microcavity 11, resulting in a maximum intracavity intensity of 25 $mW/cm^2$. This is far below the 500 $mW/cm^2$ power necessary to saturate the $Er^{3+}$ transition for a $Er^{3+}$ density of $10^{23}/cm^3$.

Figure 10:
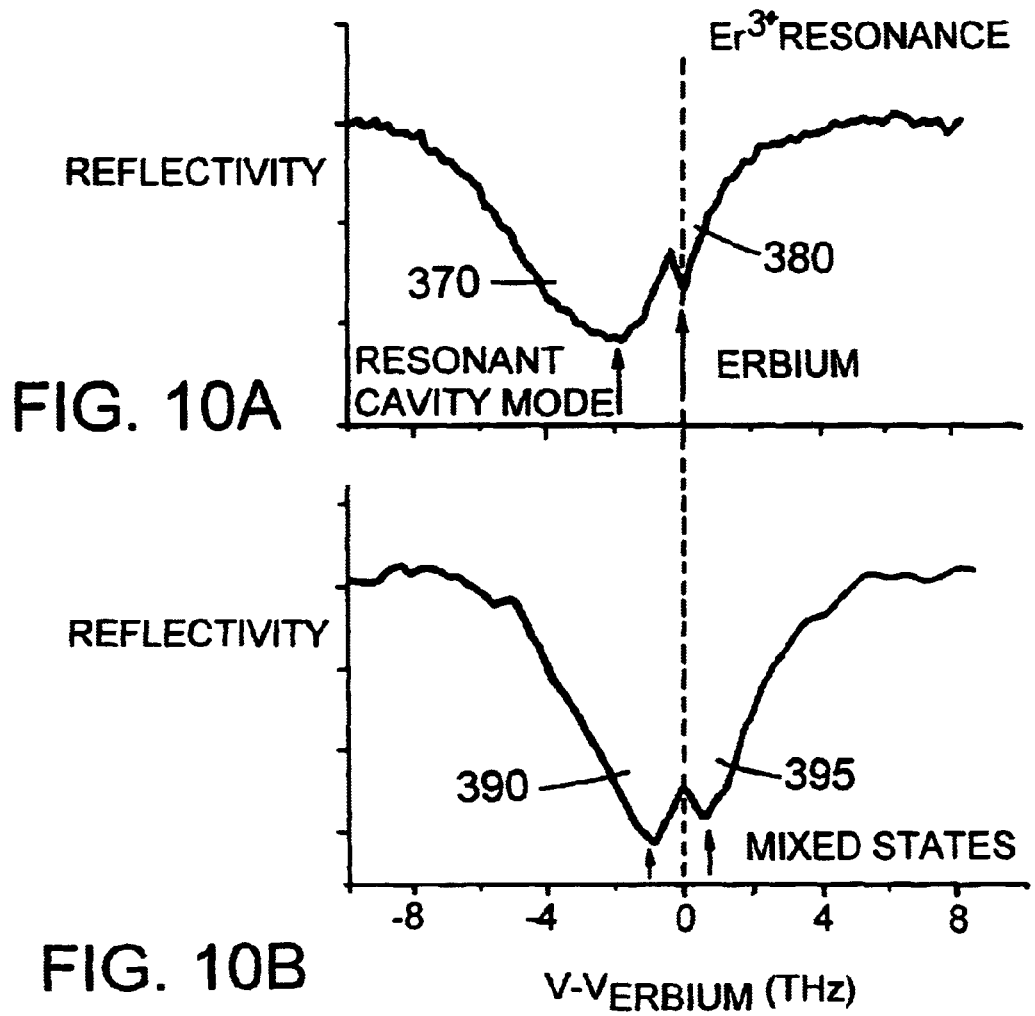
FIGS. 10A and 10B show measured reflectivity spectra of the microcavity structure of FIG. 7.

Referring to FIGS. 10A and 10B, reflectivity spectra were recorded in the apparatus described above under the same conditions except that the probe beam was incident on different portions of the DBR surface. When the probe is incident on different portions of the DBR, small inhomogeneities in the thickness of the optically-active layer between those positions cause the probe beam to experience slightly different resonant cavity modes, $\lambda_{cav}$, of the microcavity. The reflectivity spectrum shown in FIG. 10A is similar to the calculated spectrum shown in FIG. 9C and exhibits two transmission features, a feature 370 near the resonant cavity mode and another feature 380 near the $Er^{3+}$ resonance. The reflectivity spectrum shown in FIG. 10B is similar to the calculated spectrum shown in FIG. 9D and also exhibits two transmission features, 390 and 395, which represent the two non-degenerate mixed states split apart by VRS. As seen in FIGS. 9A–9F and 10A–10B, the microcavity structure reflects or transmits different wavelengths of light depending upon the thickness, $L_{cav}$, of the microcavity.

Figure 11:
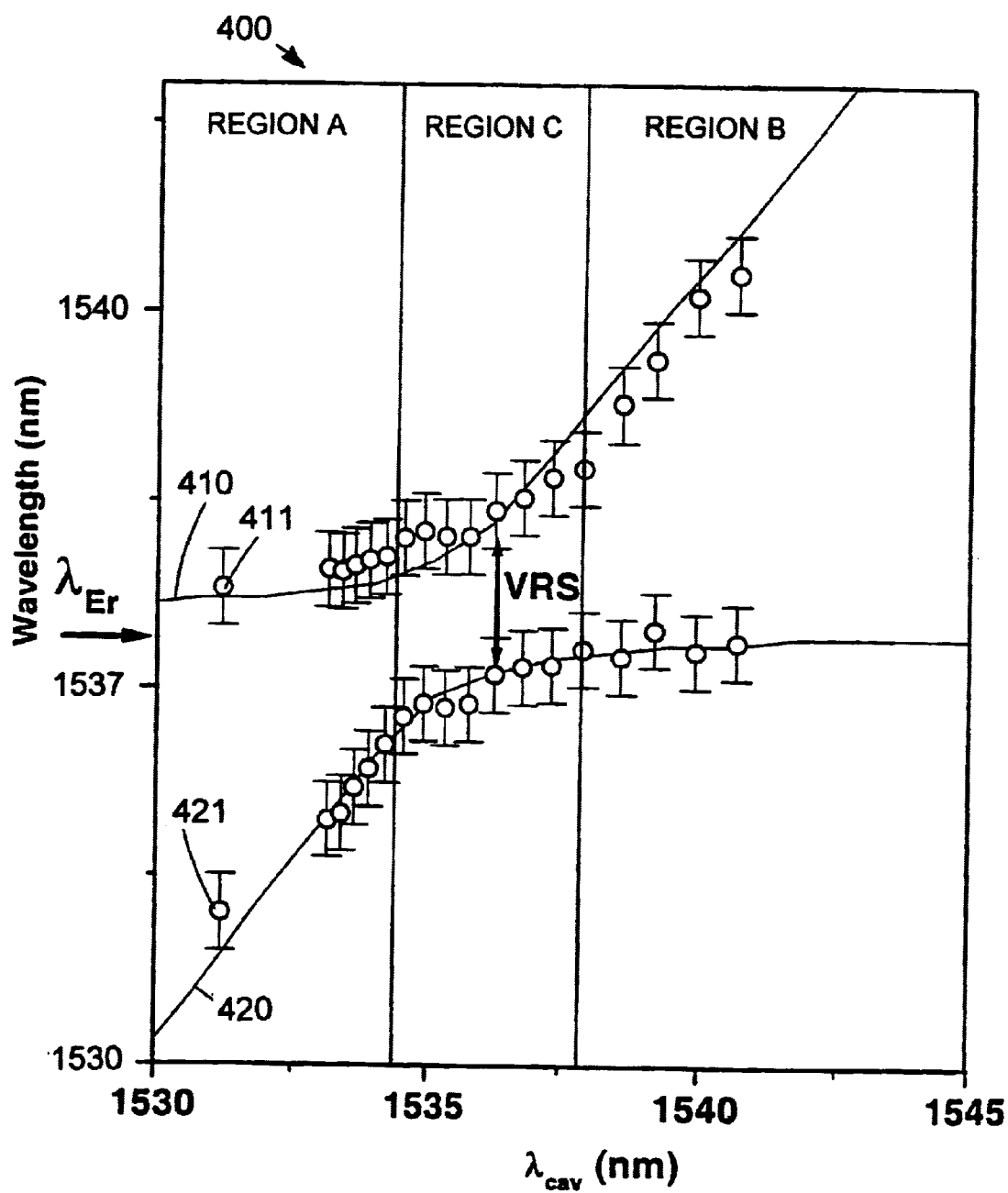
FIG. 11 is a graph showing a plot of light wavelengths that correspond to resonant frequencies for the microcavity and the optically-active material.

FIG. 11 shows a plot 400 of the wavelength of the two spectral transmission features obtained by recording reflectivity spectra as a function of the resonant cavity mode ($\lambda_{cav}$) of the microcavity such as described with respect to FIGS. 10A and 10B. The wavelengths of each pair of features (open circles) are plotted along curves 410 and 420 at each measured resonant cavity mode ($\lambda_{cav}$). At a specific cavity mode, the point on curve 410 represents the wavelength position of the spectral transmission feature which lies at lower energy and the point on curve 420 represents the wavelength position of the spectral feature which lies at higher energy. In region A, the cavity mode resonance is higher in energy than the $Er^{3+}$ resonance (i.e., the vacuum electromagnetic field state in the microcavity is higher in energy relative to the $Er^{3+}$ state). As a result, the amount of mixing between the two states is reduced (see for example FIGS. 9A–9C). In region B, the cavity mode resonance is lower in energy than the $Er^{3+}$ resonance (i.e., the vacuum electromagnetic field state in the microcavity is lower in energy relative to the $Er^{3+}$ state). In this region, the amount of mixing between the two states is also reduced (see for example FIGS. 9E and 9F). When the cavity mode is off-resonance with respect to the $Er^{3+}$ resonance, the wavelength of one spectral feature of the microcavity is approximately constant at about the $Er^{3+}$ resonance as a function of $\lambda_{cav}$ (curve 410 in Region A and curve 420 in Region B) while the other spectral feature wavelength tracks the change in the cavity mode resonance (curve 420 in Region A and curve 410 in Region B). This effect is due to the reduced mixing between the two states. When the amount of mixing increases, changes in the resonant cavity mode affect both resonances. See, for example region C, in which two non-degenerate mixed states are observed as the cavity mode is tuned into resonance with the $Er^{3+}$ resonance i.e., the vacuum electromagnetic field state and the $Er^{3+}$ state become degenerate (see FIG. 9D). Region C includes an "anticrossing"(i.e., a divergence of curves 410 and 420) at the $Er^{3+}$ wavelength of about 1537 nm. This indicates a strong interaction between the confined light (vacuum electromagnetic field state) and the Er atoms in $Er_2O_3$ at 1537 nm. In region C, the spectral response of the microcavity is sensitive to small changes in the VRS parameters (R, L, and $\alpha_0$) and the cavity mode resonance, i.e., the cavity length. In regions A and B, the microcavity is less sensitive to changes in the VRS parameters, since mixing (if any) between the Er state and the vacuum electromagnetic field state is substantially reduced due to the energy difference between the two states.

The curves 410 and 420 in FIG. 11 and the calculated reflectivity spectra shown in FIGS. 9A–9F were calculated via standard semi-classical models based on transfer matrices which describe the light-matter interaction. Semi-classical models based on transfer matrices are described, for example, in Optical Physics by S. G. Lipson, H. Lipson, and D. S. Tanhauser, Cambridge University Press, Cambridge, 1995, and R. P. Stanley, R. Houdre, O. Oesterley, M. Ilegems, and C. Weisbuch, Physics Review A, 48, 2246, 1993.

The resonant microcavities described herein have applications in different areas of optics and optoelectronics. For example, they can be used in an optical switching device which tunes the resonant cavity mode to change which wavelengths are transmitted and reflected by the microcavity structure. In such an optical switching device, a driver applies a mechanical or electrical stress to change the layer thicknesses of the cavity and thereby change the resonant cavity mode. Alternatively, a device can apply an optical signal to the resonant microcavity to alter the index of refraction of the layers within the cavity and thereby change the resonant cavity mode.

Figure 12:
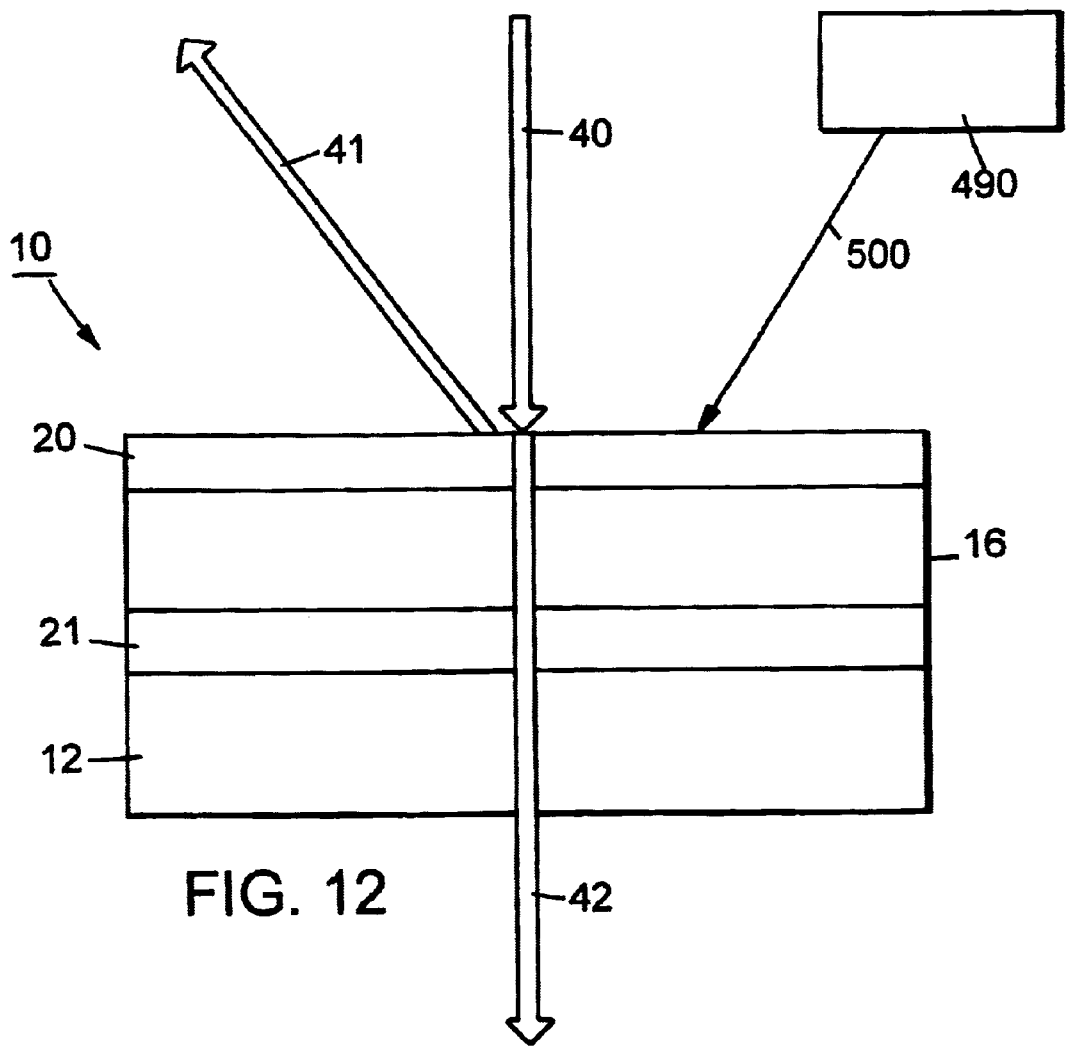
FIG. 12 is a side view of the structure of FIG. 1 showing different wavelengths of light (light beams) reflecting from, and passing through, the microcavity.

An example of a device which alters the cavity mode by applying an optical signal to the microcavity will now be described. Referring to FIG. 12, a device 490 directs a light signal 500 onto a DBR of the microcavity to change the indices of refraction of Si layers 22 and/or $SiO_2$ layer 24 (not shown), and thereby effect the resonant cavity mode which, in turn, changes the VRS splitting and the reflectivity of the microcavity. The change in resonant cavity mode alters which wavelengths of light will be reflected (41) by or transmitted (42) through the microcavity. In order to alter the index of refraction of a material, the energy (wavelength) of light signal 500 needs to be high enough so that photons from signal 500 are injected into the conduction band of the material. The bandgap for Si is about 1.1 eV.

Figure 13:
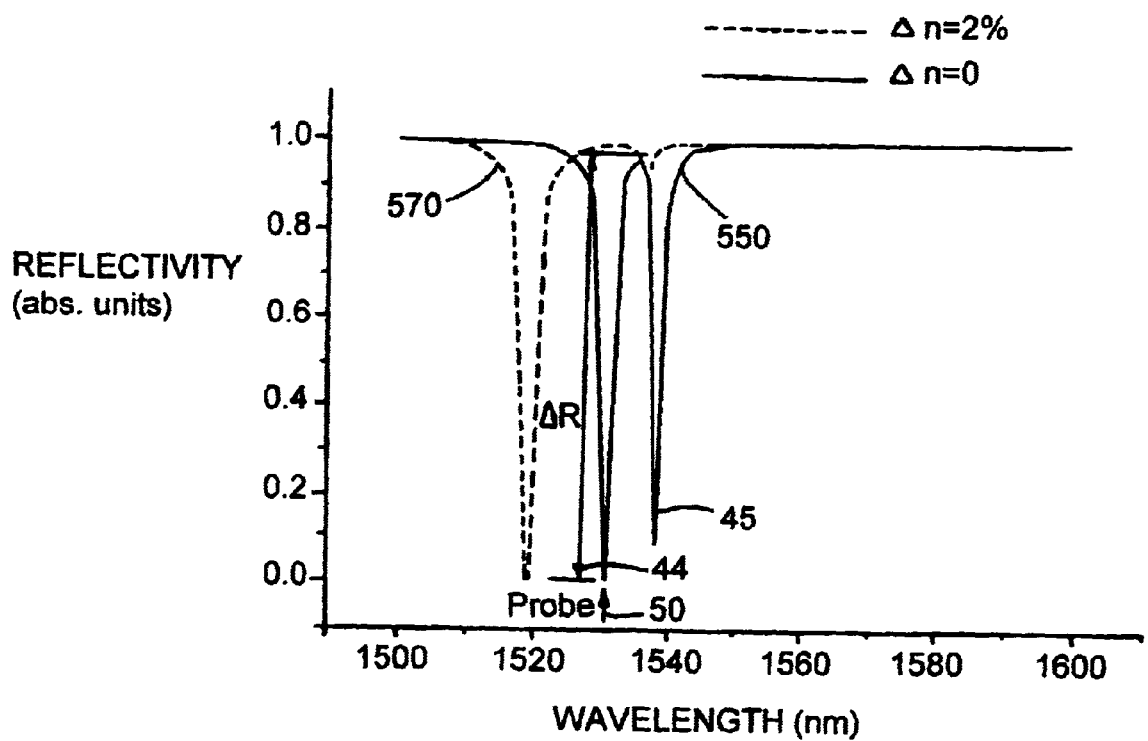
FIG. 13 is a graph showing a change in reflectivity of a resonant microcavity.

By way of example, FIG. 13 shows a reflectivity spectrum 550 of a microcavity having a cavity mode in resonance with the $Er^{3+}$ resonance (solid line). The microcavity produces a strong and observable light-matter interaction which results in two transmission features representing two non-degenerate mixed states 44 and 45, respectively. The transmission of probe signal 50, centered on transmission feature 44, through the microcavity is changed by ΔR when an external pump signal (not shown) of sufficient energy (wavelength) injects photons into the conduction band of the DBR materials to change the index of refraction by about 2%. The change of the index of refraction effects the resonant cavity mode and alters the spectral response of the microcavity such that the probe 50 is reflected rather than transmitted through the microcavity. See, for example, reflectivity spectrum 570 (dashed line) which results when the index of refraction of the microcavity reflector is changed by about 2%.

Figure 14:
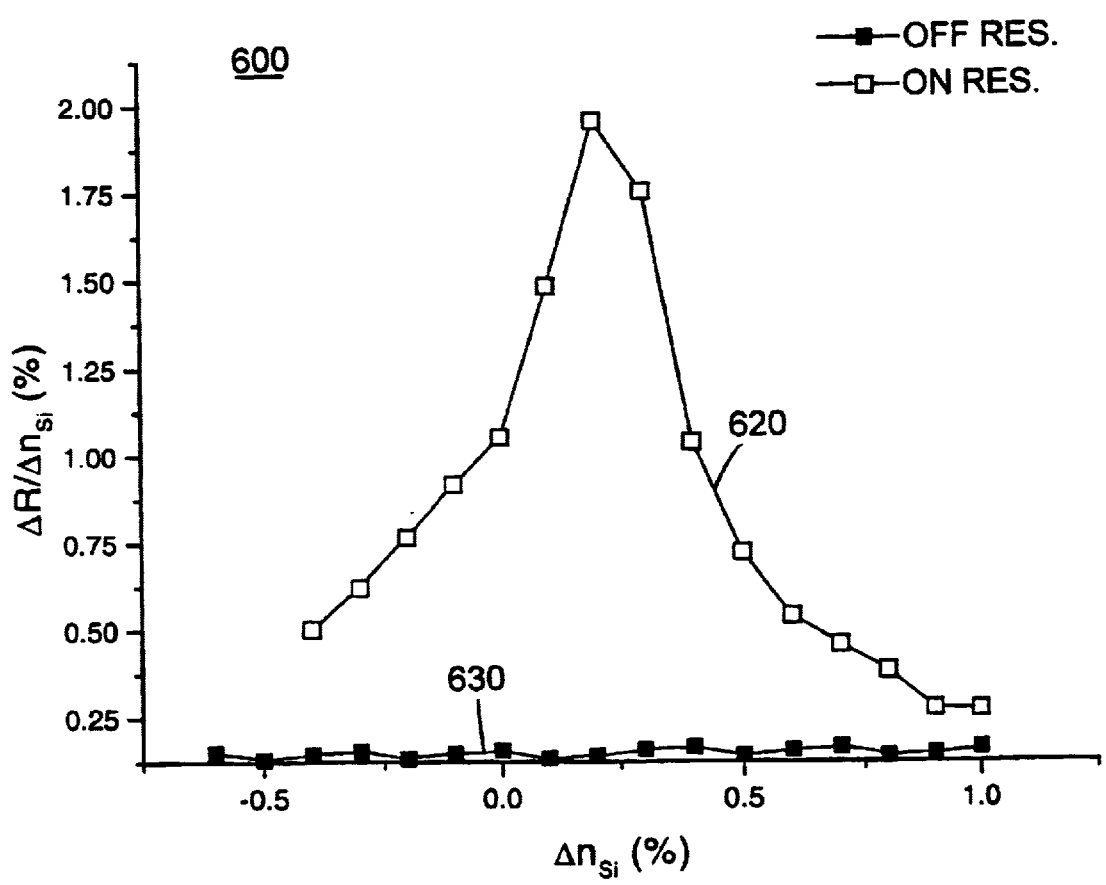
FIG. 14 is a graph showing the sensitivity of the microcavity to changes in the index of refraction.

In general, the microcavity is more sensitive to changes in the index of refraction of the DBR materials when the cavity mode is resonant with the $Er^{3+}$ resonance. Referring to FIG. 14, plot 600 shows the change in a normalized measure of reflectivity ($\Delta R/\Delta n_{si}$) of a spectral transmission feature of one of the mixed states as a function of the change in the index of refraction of the Si($\Delta n_{si}$). As shown by curve 620, when the cavity mode is resonant with the $Er^{3+}$ resonance, the microcavity is much more sensitive to changes in the index of refraction relative to when the cavity mode is off-resonance with the $Er^{3+}$ resonance, as depicted by curve 630. Curve 620 represents a non-linear response to the change in the index of refraction, whereas curve 630 represents a linear response to the change in the index of refraction.

In other embodiments, several microcavity optical switches can be combined in a matrix to form a waveguide cross-connect. Each switch in the cross-connect could be tuned to pass/reflect a different wavelength of light (e.g., red, green, blue, etc.). Other applications for microcavity 11 include a GHz or THz emitter/detector. For example, Rabi oscillations occur which are in the GHz to THz range can be temporally imposed on an emission signal. Alternatively, the microcavity can emit radiation in the GHz to THz range. The GHz to THz radiation can be tuned by changing the VRS splitting. A probe signal can be introduced into microcavity 11 and the differences between VRS resonant frequencies produced in microcavity 11 can be measured to detect GHz or THz frequencies in the probe signal.

In other embodiments, the microcavity structure can be formed by sputtering the different layers of the cavity onto the structure. Sputter techniques can be used to form more periodic and homogeneous layers of the microcavity structure relative to chemical vapor deposition techniques. Increasing the periodicity and homogeneity of the layers can increase the transmission of the microcavity at the resonant cavity mode and the $Er^{3+}$ resonance.

In certain embodiments, after depositing the DBRs and optically-active layer on the substrate, the substrate can be removed by etching.

Other applications for resonant microcavities described herein include a wavelength modulator, a wavelength-division multiplexer, and voltage-controlled oscillators (VCOs). For example, one or more of the microcavities could be tuned to multiplex and demultiplex different wavelengths of light.

Other embodiments are also within the scope of the following claims.

What is claimed is:

1. A resonant microcavity comprising:

an optically-active material and two reflectors disposed on the optically-active material to form a cavity including the optically-active material;

wherein the reflectors have a reflectivity R; the optically-active material has a thickness L, an optical emission line centered at a wavelength $\lambda_c$, and an optical absorption coefficient $\alpha_0$ at $\lambda_c$, the optical emission line having an homogeneous spectral width $\delta$ and an inhomogeneous spectral width $\Delta$; and $\alpha_0 L > (1-R)$.

2. The resonant microcavity of claim 1, wherein the ratio $\alpha_0 L/(1-R)$ is greater than about 10.

3. The resonant microcavity of claim 2, wherein the ratio $\alpha_0 L/(1-R)$ is greater than about 100.

4. The resonant microcavity of claim 3, wherein the ratio $\alpha_0 L/(1-R)$ is greater than about 1000.

5. The resonant microcavity of claim 1, wherein $$\Delta < 2\sqrt{\frac{\alpha_0 L \delta^2}{(1-R)}}.$$

6. The resonant microcavity of claim 5, wherein the ratio $$\left(\Delta/2\sqrt{\frac{\alpha_0 L \delta^2}{(1-R)}}\right)$$

is less than about 1.

7. The resonant microcavity of claim 6, wherein the ratio $$\left(\Delta/2\sqrt{\frac{\alpha_0 L \delta^2}{(1-R)}}\right)$$

is less than about 0.1.

8. The resonant microcavity of claim 7, wherein the ratio $$\left(\Delta/2\sqrt{\frac{\alpha_0 L \delta^2}{(1-R)}}\right)$$

is less than about 0.01.

9. The resonant microcavity of claim 1, wherein the cavity is a Fabry-Perot cavity having an optical resonance at wavelengths within a range of about $\lambda - 2\Delta$ and about $\lambda + 2\Delta$.

10. The resonant microcavity of claim 9, wherein the cavity is has an optical resonance at wavelengths within a range of about $\lambda - \Delta$ and about $\lambda + \Delta$.

11. The resonant microcavity of claim 10, wherein the cavity has an optical resonance at wavelengths within a range of about $\lambda - 0.1\Delta$ and about $\lambda + 0.1\Delta$.

12. The resonant microcavity of claim 1, wherein the reflectors are arranged opposite each other with the optically-active material between them.

13. The resonant microcavity of claim 1, wherein each of the reflectors comprises a metal film.

14. The resonant microcavity of claim 1, wherein the reflectors comprise distributed Bragg reflectors (DBR).

15. The resonant microcavity of claim 14, wherein the DBRs are arranged opposite each other with the optically-active material between them, each DBR comprising alternating layers of materials having different indices of refraction.

16. The resonant microcavity of claim 15, wherein the alternating layers of materials comprise one or more of the following: semiconductors, conductive matter oxides, glasses, glass-like oxides, and polymers.

17. The resonant microcavity of claim 15, wherein the alternating layers have high and low indices of refraction $n_H$ and $n_L$ and thicknesses on the order of $\lambda/4n_H$ and $\lambda/4n_L$.

18. The resonant microcavity of claim 17, wherein each DBR includes between 2 and 22 alternating layers.

19. The resonant microcavity of claim 1, wherein the optically-active material has an average index of refraction that is higher than an average index of refraction of the reflectors.

20. The resonant microcavity of claim 19, wherein the separation between the two reflectors is an even-numbered multiple of $\lambda_c/2n$.

21. The resonant microcavity of claim 1, wherein the optically-active material has an average index of refraction that is lower than an average index of refraction of the reflectors.

22. The resonant microcavity of claim 21, wherein the separation between the two reflectors is an odd-numbered multiple of $\lambda_c/2n$.

23. The resonant microcavity of claim 1, wherein the optically-active material comprises Er.

24. The resonant microcavity of claim 1, wherein the optically-active material comprises $Er_2O_3$ embedded in a layer of $SiO_2$.

25. The resonant microcavity of claim 1, wherein the optically-active material comprises crystalline $Er_2O_3$.

26. The resonant microcavity of claim 1, wherein the optically-active material comprises a rare earth doped layer of Si.

27. The resonant microcavity of claim 1, wherein the optically-active material comprises a rare earth doped layer of $SiO_2$.

28. The resonant microcavity of claim 1, wherein the optically-active material comprises a rare earth doped host matter, and the host matter has a negligible luminescence.

29. The resonant microcavity of claim 28, wherein the rare earth doped host material comprises one or more lanthanide series elements with numbers 57 through 71.

30. The resonant microcavity of claim 1, wherein the optically-active material comprises a semiconducting light-emitting material.

31. The resonant microcavity of claim 30, wherein the semiconducting light-emitting material comprises one or more of the following: GaAs, GaAlAs, GamnAs, GaInPAs, GaN, GaP, and InP.

32. The resonant microcavity of claim 1, wherein the optically-active material comprises a doped semiconductor which emits radiation at a wavelength that is higher than a semiconductor band gap transition associated with the doped semiconductor.

* * * * *